U S008279409B1

United States Patent
Sezginer et al.

(10) Patent No.: US 8,279,409 B1
(45) Date of Patent: Oct. 2, 2012

(54) SYSTEM AND METHOD FOR CALIBRATING A LITHOGRAPHY MODEL

(75) Inventors: Abdurrahman Sezginer, Monte Sereno, CA (US); Hsu-Ting Huang, Sunnyvale, CA (US); Jesus Orsely Carrero, Mountain View, CA (US); Tatung Chow, San Jose, CA (US); Kostyantyn Chuyeshov, Palo Alto, CA (US); Gokhan Percin, Los Gatos, CA (US)

(73) Assignee: Cadence Design Systems, Inc., San Jose ( * ) Notice: Subject to any disclaimer, the term of this patent is extended or adjusted under 35 U.S.C. 154(b) by 551 days.

(21) Appl. No.: 12/536,425

(22) Filed: Aug. 5, 2009

(51) Int. Cl.
*G03B 27/32* (2006.01)
*G03B 27/54* (2006.01)
*G06F 17/50* (2006.01)

(52) U.S. Cl. .............. 355/77; 355/67; 716/50; 716/55

(58) Field of Classification Search .... 250/492.2–492.3; 355/53, 55, 67, 77; 430/30, 311–312; 716/50–56
See application file for complete search history.

(56) References Cited

U.S. PATENT DOCUMENTS

| | | | |
|---|---|---|---|
| 2006/0248496 A1* | 11/2006 | Sezginer et al. | 716/20 |
| 2006/0248499 A1* | 11/2006 | Sezginer et al. | 716/21 |
| 2007/0186206 A1* | 8/2007 | Abrams et al. | 716/19 |

* cited by examiner

*Primary Examiner* — Hung Henry Nguyen
*Assistant Examiner* — Colin Kreutzer
(74) *Attorney, Agent, or Firm* — Kenyon & Kenyon LLP

(57) ABSTRACT

The present invention provides a method for calibrating a computational model of a lithography process by calculating a demerit function using an intensity measurement at a location of a wafer; and calibrating the lithography model or a mask making model by determining values of parameters of the computational model using the calculated demerit function. The method may also use a second demerit function that is defined by the sum of squares of differences between a simulated and measured critical dimensions of a feature on the wafer.

15 Claims, 10 Drawing Sheets

SYSTEM AND METHOD FOR CALIBRATING A LITHOGRAPHY MODEL

TECHNICAL FIELD

The present invention relates to systems and methods for modeling a lithographic process, more particularly, some embodiments relate to a method for calibrating a lithography model by minimizing a difference between a simulated image intensity and an intensity threshold.

DESCRIPTION OF THE RELATED ART

Integrated circuits are manufactured by iterating procedures of depositing a film of material on a wafer, and patterning the deposited layer. To pattern a film, the film is coated by a resist material. An image of the desired pattern or the negative of the desired pattern is projected on the resist optically or by an electron beam. The exposed part of a positive resist chemically changes so that it becomes soluble in a developer solution. The resist thus forms a stencil on the film to be patterned. The pattern of the resist is transferred to the underlying film of material typically by a plasma-etch process.

The proximity effect is well known in the art of lithography. The phenomenon can affect electron beam and optical lithography processes. In electron beam lithography, the proximity effect is caused primarily by electron-scattering. An electron intended for an image point can be scattered and it can create secondary electrons that could expose resist in a neighborhood surrounding the intended image point. In optical lithography, wave nature of light precludes a photon being directed to a pin-pointed location in the image plane. The photon is likely to expose the resist in a neighborhood of the intended image point. Another contributor to the proximity effect is diffusion of molecules that make up the latent image in the resist. Generally, the proximity effect becomes more pronounced as dimensions of features, or distances between features, become comparable to or smaller than the resolution of the imaging process. Hence the term "proximity effect." If not compensated, the proximity effect can alter critical dimensions (CD) of the pattern, or even the topology of the pattern.

In optical lithography, the dimension of a feature is expressed as $(k_1 \cdot \lambda)/NA$, where $\lambda$ is the exposure wavelength, NA is the numerical aperture of the projection system, and $k_1$ is a dimensionless factor. The smaller is the $k_1$ factor, the stronger is the proximity effect. The proximity effect becomes strong and maintaining sufficient yield becomes increasingly difficult as $k_1$ decreases below 0.35. Optical proximity correction (OPC) and resolution enhancement techniques (RET) are well-known methods to counter the proximity effect and to improve the fidelity of printed patterns. Optical proximity correction pre-distorts the pattern that is placed on the photo-mask (master copy) so that the patterns formed by lithography approximately match a target layout. The degree of matching is determined by geometric considerations. For example, edge-placement error (EPE) is the distance between an edge of a target pattern and the corresponding edge of the actual pattern formed on a semiconductor wafer. One implementation of OPC minimizes a sum of squares of edge placement errors at multiple points along the edges of a pattern, or the differences between measured and ideal critical dimensions at multiple points along the edges of a pattern.

At the time of this writing, the wavelength that is commercially used in lithography is $\lambda=193$ nm (ArF excimer laser), and the highest numerical aperture is NA=1.35. The densest line-space pattern printed by such a system, in a single-exposure, has a half-pitch of 38 nm, which amounts to $k_1=0.27$. The same wavelength and numerical aperture is planned to serve 32-nm and 22-nm nodes using double patterning. At such extreme low values of $k_1$, proximity effect is extreme. Significant geometric differences can remain between the target layout and printed pattern despite best efforts in RET and OPC.

BRIEF SUMMARY OF EMBODIMENTS OF THE INVENTION

According to various embodiments of the invention, systems and methods for calibrating a lithography model are provided. The method includes iteratively adjusting parameters of the lithography model in a way that reduces the value of a demerit function, until a convergence criterion is met. The demerit function can be evaluated by calculating a difference between an intensity threshold and an image intensity predicted by the lithography model at a location on a wafer. The locations are selected to be at the edge of a developed resist pattern.

In one embodiment, coordinates of the location are determined by contouring an edge in a resist pattern image acquired using a scanning electron microscope. In another embodiment, coordinates of the location is determined by measuring the width of a symmetric feature in the resist pattern.

In another embodiment, the method also includes iteratively adjusting parameters of the lithography model in a way that reduces the value of a second demerit function. The second demerit function can be evaluated by calculating a difference between a measured dimension of a printed feature and a corresponding dimension simulated using the lithography model.

In yet another embodiment, the method further includes determining whether a feature can not be printing or will only print marginally according to a lithography model simulation prior to calculating the second demerit function; and then discarding the critical dimension measurement of the feature to prevent it from being used in the calculation of the second demerit function.

In yet another embodiment, the demerit function comprises a first term defined by a sum of squares of differences between simulated intensity values and an intensity threshold. Optionally, each term of the cost function can be normalized. The second demerit function comprises a second term defined by the sum of squares of differences between a simulated and measured critical dimension of the feature on the wafer. The second demerit function can also be a weighted cost function.

In accordance with one embodiment of the present invention, a method for calibrating a lithography model includes: obtaining a first set of model parameters from a first minimization process, which minimizes a first demerit function with respect to parameters of the model. The first demerit function includes evaluating a difference between an image intensity calculated by the model and an intensity threshold. The method further includes; determining whether a feature is not printing or marginally printing according to a simulation by the lithography model using the first set of parameters; listing a set of non-printing or marginally printing features; and obtaining a second set of model parameters by a second minimization process, which minimizes a second demerit function with respect to parameters of the model. The second cost function includes evaluating a difference of measured and simulated critical dimensions. The second minimization process starts using the first set of model parameters, and the non-printing or marginally printing features are removed from the definition of the second demerit function.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

It should be understood that the invention can be practiced with modification and alteration, and that the invention be limited only by the claims and the equivalents thereof.

DETAILED DESCRIPTION OF THE EMBODIMENTS OF THE INVENTION

According to some embodiments of the present invention, a lithography model calibration method, apparatus, or system is provided, wherein such method, apparatus, or system is configured to determine unknown parameters of the lithography model by minimizing a cost function. In some embodiments, such methods, apparatuses, and systems include determining a difference of an image intensity calculated by the lithography model at a point that is observed to be at the edge of a printed resist pattern, and an intensity threshold.

Before describing the invention in detail, it is useful to describe an example environment in which the invention may be implemented. In one embodiment, the invention can be implemented using a software application such as, for example, a lithography model calibration tool running on a computer or computing system. The computer or computing system might be a personal computer, workstation, minicomputer, mainframe, processors distributed over a network, etc. The computer might include various input devices, such as a keyboard, mouse, trackball, etc.; various output devices, such as a monitor, printer, etc.; various communication ports such as network connections, USB ports, serial and parallel I/O ports, etc.; and various storage devices, such as ROM, RAM, disk drives, magnetic disks, magnetic tape drives, etc.

Monitors and printing devices can be used to provide a visual display of the design as well as other ancillary information to aid the developer in the design process, including various GUIs, graphical representations and other information. Storage devices, whether networked or local, can be used to store data and other information including design tools, design kit information, libraries and so on.

Figure 1:
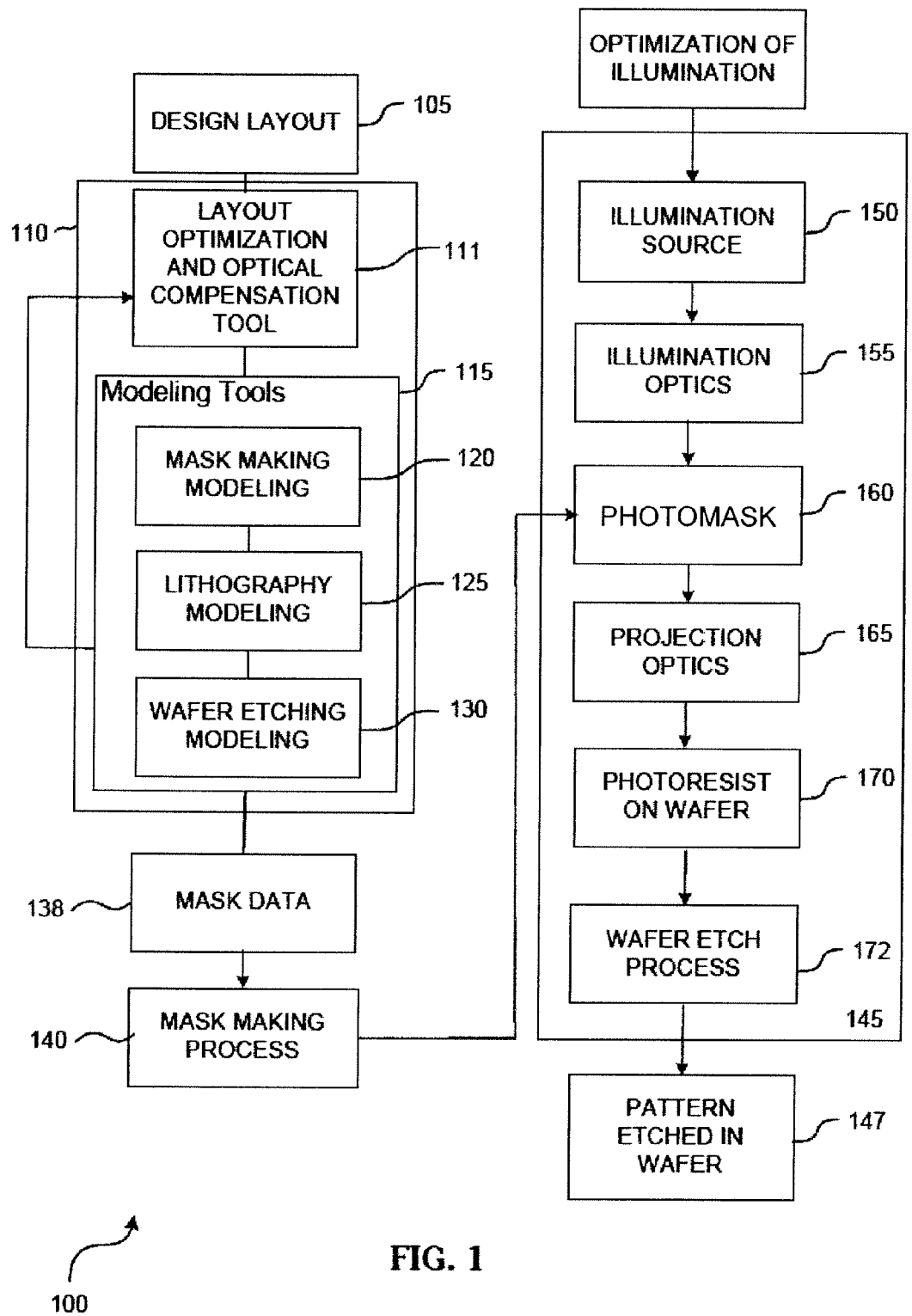
FIG. 1 illustrates both an example environment in which a calibrated lithography model is used, and example processes that are modeled by the lithography model.

FIG. 1 is a diagram illustrating an example patterning process 100 that transfers a design layout to a pattern etched into a wafer. This is an example environment in which a model may be calibrated, and also an example environment in which a calibrated model may be used. Environment 100 includes: design layout, model-based optimization of photomask data, production of a photomask, optical lithography, and plasma etching of the wafer. Referring now to FIG. 1, the illustrated example environment 100 includes a design layout process 105, a layout optimization process 110 which uses a computational model of the patterning process 115, a photomask (mask for short) production process 140, and a wafer patterning process 145. Layout optimization process 110 may include the application of optical proximity compensation and process proximity compensation techniques to optimize the layout such that the final circuit patterns on the wafer are rendered to have the geometric shapes and circuit parameters as close as possible to their design intent.

Generally, the production of circuits on a wafer starts with design layout 105. A layout may include a dataset that comprises a plurality of polygons. The union of these polygons generally defines the shapes and features of circuit patterns to be etched in the wafer. Layout 105 can also be referred to as the target pattern. Once target pattern is generated, a photomask 160, which is a physical master copy of the pattern, is produced. The pattern on photomask 160 is repeatedly transferred on to semiconductor wafers by a lithography process 145 to produce many integrated circuits. Methods and apparatus for manufacturing photomasks are known to those skilled in the art.

Patterns are usually written on the photomask by a scanning laser or electron beam system that is capable of exposing a radiation sensitive resist on the photomask. The image written on the resist is developed, and the pattern of the resist is transferred to a film underlying the resist, deposited on a mask blank. The mask blank is usually made of fused silica. The mask pattern can be formed on a molybdenum-silicon (MoSi), chrome, chrome-oxide, or tantalum-nitride film deposited on fused silica. In chromeless phase shift masks and alternating phase-shift masks, a portion of the pattern is etched into the fused silica mask blank.

In extreme ultraviolet (EUV) lithography, the mask is reflective. The mask blank can be coated with alternating layers of two materials of distinct refractive index, such as molybdenum and silicon, to form a film stack that is highly reflective at EUV wavelength (about 13.5 nm). The mask pattern can be etched into an absorber film deposited on top of the reflective film stack. In some embodiments, lithography is performed without any physical mask. Examples of this are electron-beam-direct-write lithography and optical maskless lithography. In direct-write lithography, one or many beams are focused on the wafer and switched on and off as the beam(s) are scanned. The mask pattern in this case is not captured in a physical master copy, but in a dataset that is used to scan and switch the beam(s). In optical mask-less lithography, the mask pattern is dynamically formed by a spatial modulator, which comprises an array of micro-mirrors or other light modulators. This invention is equally applicable to embodiments that use a physical mask, an array of light modulators, direct write systems, or other photolithography systems that form an image in a radiation sensitive resist.

In general, the mask pattern is not a scaled replica of the target pattern 105 because of distortions introduced into the mask pattern by patterning process 145. Process proximity compensation (PPC) 110 is a computational tool that optimizes mask data 138 such that the pattern 147 etched in the wafer is as close as possible to the design intent. In other words, process proximity compensation 110 compensates for the distortions of the patterning process 140, 145.

An essential element of the compensation tool 110 is a computation model 115 of the patterning process. The computational model 115 comprises one or more of: a model 120 of the mask making process, a model 125 of the lithography process, a model 130 of the wafer etching process. Model 120 of the mask making process simulates the physical mask making process 140. Lithography model 125 simulates operation of physical components 150, 155, 160, 165, and 170. Wafer etch model 130 simulates the physical etch process 172. Tools used for mask modeling, lithography modeling, and wafer etching modeling are well known to those skilled in the art of lithography.

An element of the compensation tool 110 is a computation model 115 of the patterning process. The computational model 115 comprises one or more of: a model 120 of the mask making process, a model 125 of the lithography process, a model 130 of the wafer etching process. Model 120 of the mask making process simulates the physical mask making process 140. Lithography model 125 simulates operation of physical components 150, 155, 160, 165, and 170. Wafer etch model 130 simulates the physical etch process 172. Tools used for mask modeling, lithography modeling, and wafer etching modeling are well known to those skilled in the art of lithography.

Once the optimization of the photomask data is completed, a photomask 160 can be created. Once photomask 160 is created, it can then be used to pattern wafer 170. In the case of optical projection lithography, this patterning process starts at an illumination source 150, which provides a light source to an illumination optics 155. Illumination source 150 can be, for example, a deep ultra-violet (DUV) light source or an extreme ultra-violet (EUV) light source. An example DUV light source 150 is an ArF excimer laser of 193 nm wavelength.

Illumination optics 155 can be used to condition the light coming from illumination source 150. For example, illumination optics 155 may include a partial coherence adjuster to vary the angular distribution of electromagnetic radiation that is incident on photomask or reticle 160. The illumination optics 155 may include components to render the illumination polarized or unpolarized. The polarization state and the distribution of illumination among directions of incidence affect the quality of the projected image in a way that depends on the pattern.

The light that is partially blocked and diffracted by photomask 160 enters projection optics 165, which project the pattern on to a photoresist film 170 that is coated on the wafer. Projection optics 165 are usually designed to scale down the pattern, typically by a factor of 4, but otherwise to form the image with least amount of distortion and aberrations. After the photoresist is exposed, it is subject to post-exposure-bake followed by a wet developing process. This forms a resist pattern on the wafer. The resist pattern is transferred to a layer of the wafer by typically a plasma-etch process 172, which can further distort the pattern and alter its critical dimensions.

Although an optical projection lithography process has been discussed, one skilled in the art understands that the layout optimization tool or optical compensation tool 110 can also be implemented with other lithography techniques such as, for example, electron projection lithography, electron-beam direct-write, EUV direct-write lithography, and other lithography techniques.

From time-to-time, the present invention is described herein in terms of these example environments. Description in terms of these environments is provided to allow the various features and embodiments of the invention to be portrayed in the context of an exemplary application. After reading this description, it will become apparent to one of ordinary skill in the art how the invention can be implemented in different and alternative environments.

The accuracy and predictive power of the computational model 115 of the patterning process facilitates accuracy of the patterning process 100 in some embodiments. Accurately predicting the patterning process with a mathematical model is achieved by adjusting some parameters of the model so that the predictions of the model are in agreement with observations. This process is called model calibration.

Figure 2A:
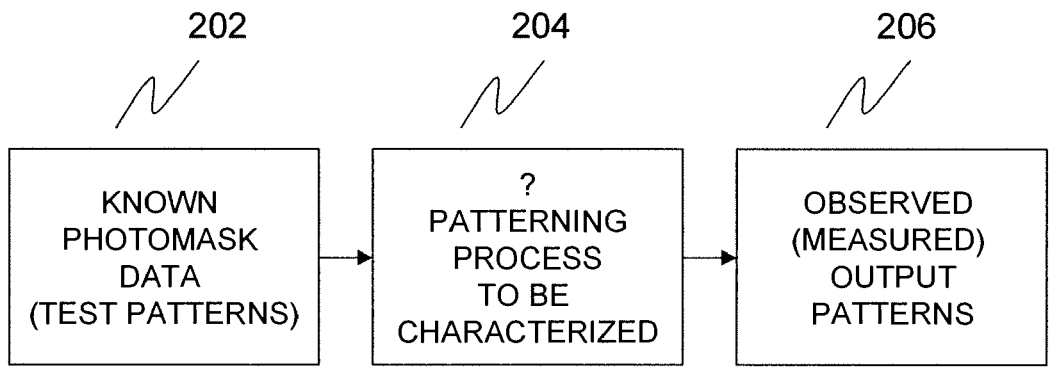
FIG. 2A illustrates known and unknown quantities in model calibration in accordance with embodiments of the present invention.
Figure 2B:
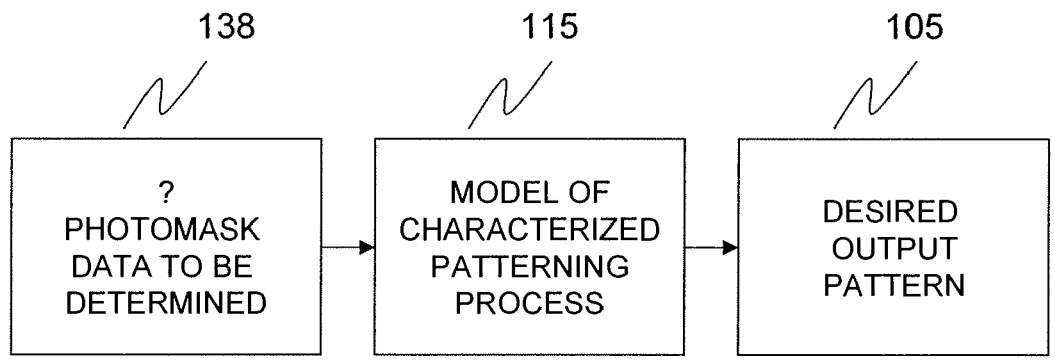
FIG. 2B illustrates known and unknown quantities in photomask data optimization wherein a model calibrated in accordance with one embodiment of the present invention is utilized.

FIG. 2A and FIG. 2B schematically show known and unknown objects in two distinct inverse problems of computational lithography: model calibration and photomask data optimization. Referring to FIG. 2A, model calibration includes characterizing the physical process, 140 and 145, or any part of the physical process. Model calibration includes inputting a set of photomask data, corresponding to a set of test patterns 202, to a patterning process 204 to be characterized; and measuring an aspect 206 of a test pattern as printed by the process under test 204. Calibrating the model photomask data using the calibrated model. The process shown in FIG. 2B is implemented by the compensation tool 110 in FIG. 1. Referring to FIG. 2B, in context of optimizing the photomask data, the desired output pattern 105 and the calibrated model 115 (characterization of the patterning process 204) are known, and the photomask data 138 needs to be solved.

Figure 3:
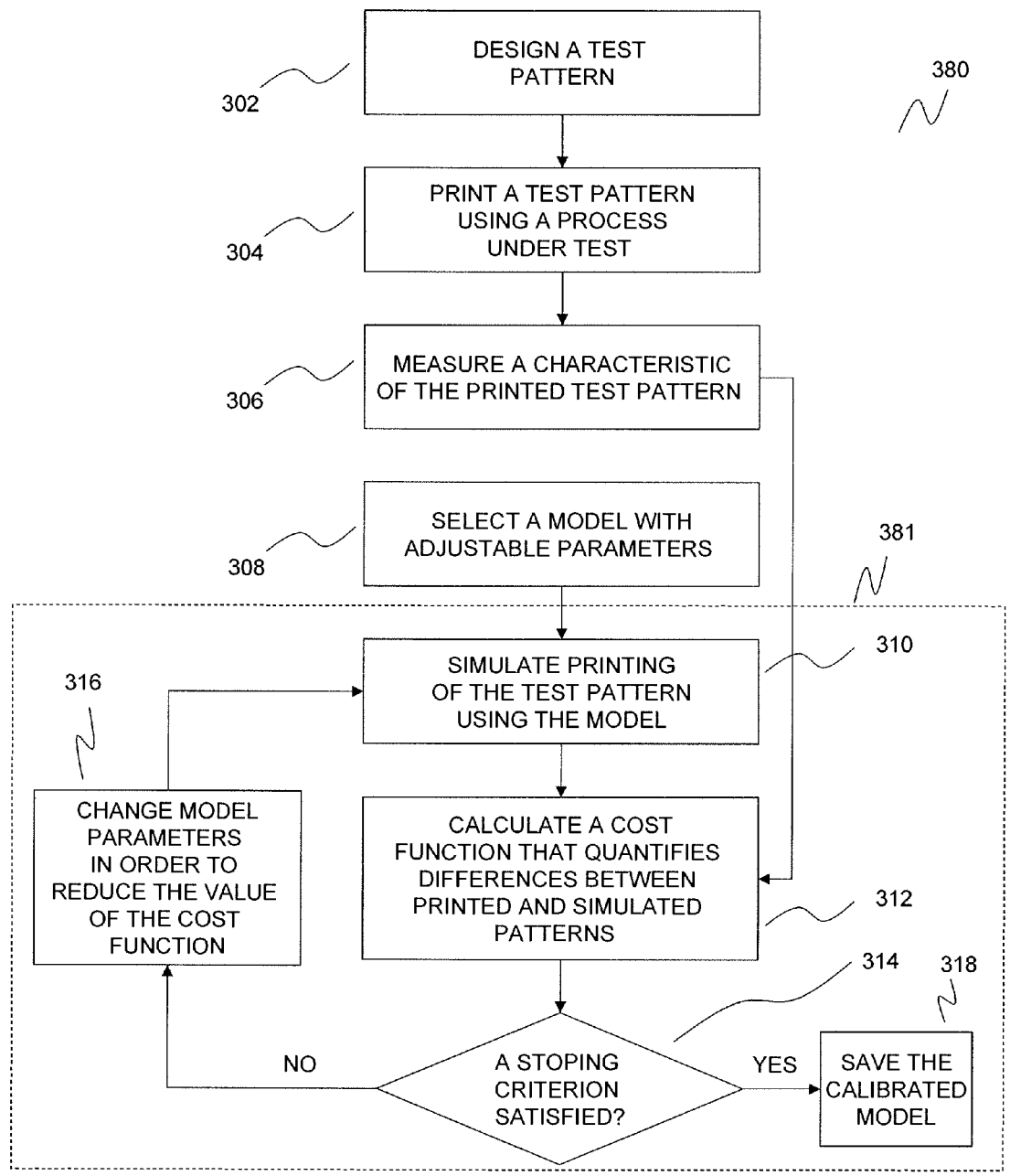
FIG. 3 illustrates an example high-level flow for calibrating a lithography model in accordance with one embodiment of the present invention.

FIG. 3 illustrates a high-level flow diagram of model calibration. Referring now to FIG. 3, a set of test patterns are generated at 302 to characterize the patterning process, which consists of 140 and 145 in FIG. 1, or a part of the patterning process. Test patterns have shapes, pitches and dimensions that are similar to the circuit patterns 105 that will be printed using the patterning process. The test patterns are further selected to probe parameters of model that are unknown before the calibration process. In procedure 304, the test patterns are printed on a test wafer using the patterning process to be modeled. Once the test wafer is printed, characteristics of circuit features on the test wafer are measured in procedure 306. Examples of measured characteristics include critical dimensions such as widths of lines, spaces between lines, and diameter of holes. In another embodiment, the characteristics measured include coordinates of points on contours (edges) of printed features.

In procedure 308, one or more models are selected having unknown parameters to be solved, i.e., calibrated. In one embodiment, the model to be calibrated is a mask making model such as model 120. In such an embodiment, a photomask is written in procedure 304, and patterns written on the photomask are measured in procedure 306. In another embodiment, the model to be calibrated is the lithography model such as model 125. In such an embodiment, patterns are printed on wafers in procedure 304 and patterns formed on the wafer are measured in procedure 306.

In procedure 310, the model is used to simulate printing of the test patterns and to predict the measured characteristics of the printed test pattern. In procedure 312, a cost function is evaluated. The cost function quantifies a difference between measured and simulated characteristics of the test pattern. In procedure 316, model parameters are altered in order to reduce the value of the cost function, and procedures 310 and 312 are repeated using the updated model parameters. Procedures 310, 312, 314, and 316 are iterated until a stopping criterion is satisfied at 314. Examples of stopping criteria include, but are not limited to, the value of cost function falling below a threshold, the value of the cost function ceasing to decrease significantly, a norm of the gradient of the cost function with respect to model parameters falling below a threshold, number of iterations, and computation time exceeding a predetermined limit. Once the stopping criterion is satisfied, optimal parameters of the model are saved at 318 for future use. Procedure 381, which comprises procedures 310, 312, 314, and 316, is an optimization algorithm. Optimization algorithms are known to those skilled in the art.

In conventional solution, the cost function used at procedure 312 of the calibration process includes differences between measured critical dimensions (CD) of the test patterns and the corresponding critical dimensions simulated by the current estimate of the model. The cost function is typically a weighted sum of squares of differences of critical dimensions:

$$f_2(p) = \sum_j w_j (CD_{j,measured} - CD_{j,simulated}(p))^2 \quad \text{(Eqn. 1)}$$

Eqn. 1 shall be referred to as a CD-based cost function. The cost function $f_2(p)$ depends on a set of model parameters p. The symbol p is generally not one number but a vector of model parameters such as resist dose-to-clear, resist diffusion length, defocus at which the test patterns were printed, etc. The index j labels dimensions or features that are measured. $CD_{j,measured}$ is the measured dimension of the $j^{th}$ feature. Some examples of measured dimensions are: the width of a line, width of a space between lines, diameter of a post or a hole. The symbol $w^j$ is a positive weight for the $j^{th}$ measurement. Eqn. 1 encompasses not using weights by setting $w_j=1$.

Figure 4:
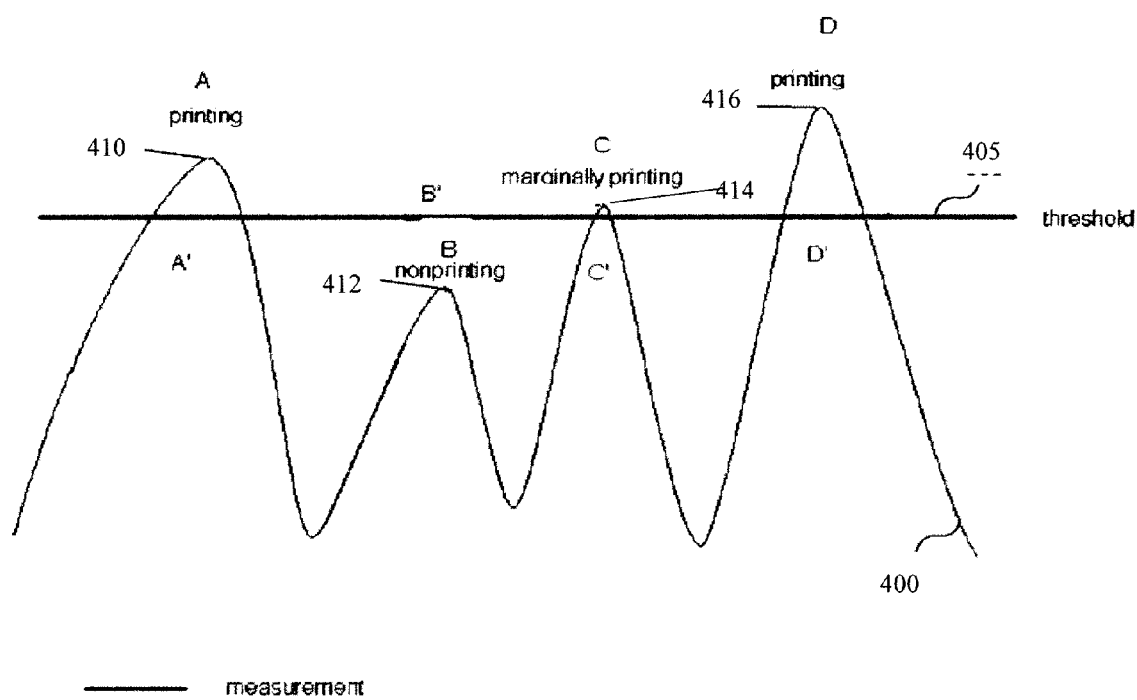
FIG. 4 illustrates an example image intensity calculated along a cut-line using a lithography model in accordance with one embodiment of the present invention.

As illustrated in FIG. 4, traditionally the simulated dimension $CD_{j,simulated}(p)$ is not differentiable, or even defined everywhere in the space of possible model parameters. FIG. 4 illustrates an intensity of an test patter image, calculated along a cut-line, using a lithography model. A resist can be positive or negative. In a positive resist, parts of the resist that are exposed to a radiation dose greater than a certain threshold become soluble in a developer solution. In a negative resist, parts of the resist that are exposed to a radiation dose greater than a certain threshold become insoluble in a developer solution. In the example of FIG. 4, the resist is positive.

Referring now to FIG. 4, features 410 and 416 have an image intensity that exceeds threshold 405 and therefore are printed. Feature 414, on the other hand, is marginally printed according to the model. As the model parameters are changed, feature 414 can disappear and its width can become undefined according to the model. This can happen if the image intensity is either everywhere below or everywhere above the threshold in a neighborhood around feature 414. The prediction whether a feature is resolved according to the model changes as model parameters p vary, irrespective of whether the feature is actually resolved on the wafer. When $CD_{j,simulated}(p)$ and consequently $f_2(p)$ become undefined, this represents a mismatch between the prediction of the model and what is measured on the wafer. Therefore, in this condition, there is a need to assign a large and well-defined value to the cost function. Such an assignment makes $f_2(p)$ not differentiable or possibly discontinuous, which is not suitable for efficient optimization algorithms such as Gauss-Newton, Newton, quasi-Newton, and Levenberg-Marquardt.

Figure 5:
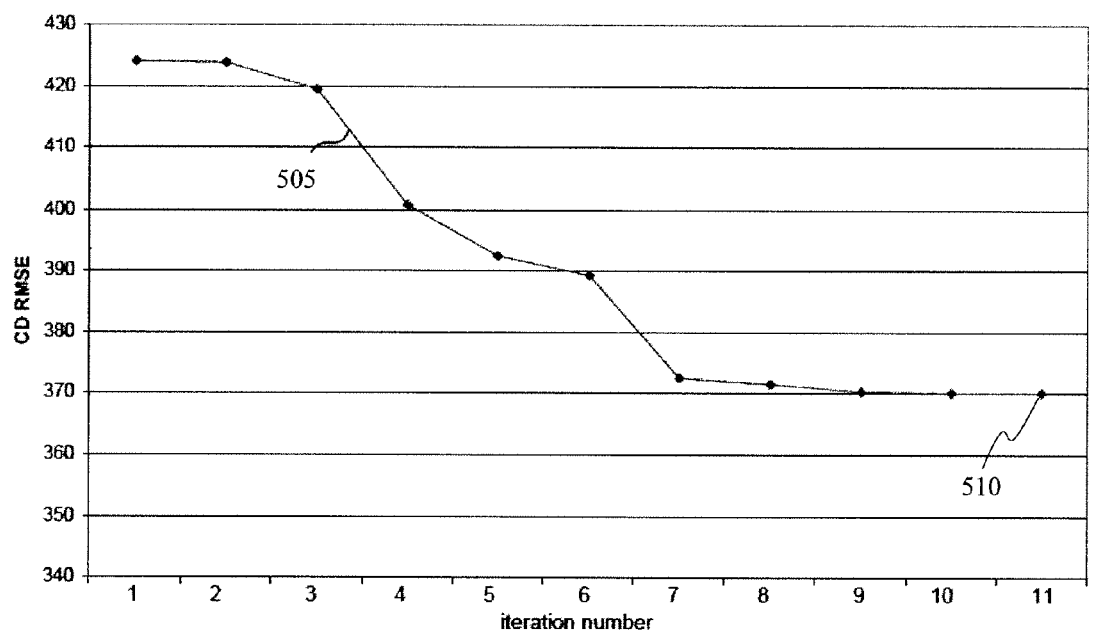
FIG. 5 illustrates a example critical dimension (CD) based cost function being iteratively reduced during a lithography model calibration in accordance with prior art.
Figure 5:

FIG. 5 illustrates what happens when a CD-based cost function is minimized by the Levenberg-Marquardt algorithm, and subset of the simulated features become non-printing. The graph 505 shows root mean square fit error, that is, $RMSE=\sqrt{f_2(p)/N}$, where N is the number of critical dimension measurements, versus iteration number in the Levenberg-Marquardt algorithm. The cost function initially decreases but stalls at 510 at a high value because some patterns are not printing according to the model and the Levenberg-Marquardt algorithm is not compatible with this condition. One of the objects of the present invention is to overcome this limitation of the prior art. Although simulated-annealing and genetic (evolutionary) algorithms are tolerant to discontinuous cost functions, they are inefficient compared to algorithms that locally approximate a smooth cost function by a quadratic, and step to the minimum of the quadratic.

In embodiments of the present invention, model calibration involves minimizing a function that includes a difference of a simulated image intensity and an intensity threshold:

$$f_1(p) = \sum_j \tilde{w}_j (\text{Intensity}(r_j; p) - I_t)^2 \quad \text{(Eqn. 2)}$$

Eqn. 2 shall be referred to as an intensity-based cost function. In Eqn. 2, Intensity($r_j$; p) is an image intensity that is calculated by a lithography model that has a set of model parameters indicated by p. The image intensity Intensity($r_j$; p) is the intensity at a point $r_j$ at the edge of a developed resist pattern on a wafer or a photomask. The index j labels and distinguishes one of many such points. The symbol $I_t$ denotes an intensity threshold which, for example, has a unit of Joule/$cm^2$, or Coulumb/$cm^2$ in the case of electron-beam lithography. A positive resist that is exposed to an intensity above $I_t$ dissolves when developed. Conversely, a negative resist that is exposed to an intensity below $I_t$ dissolves when developed. In either case, the image intensity at the edge of a developed resist pattern is equal to $I_t$. This establishes a system of non-linear equations which is solved in the least-squares sense for the set of model parameters p:

$$\text{Intensity}(r_j;p)=I_t \text{ for } j=1,2,\ldots,N \quad \text{(Eqn. 3)}$$

By solving the system of equations shown in Eqn. 3 as the least-squares is equivalent to minimizing the cost function in Eqn. 2. In a preferred embodiment, the number of equations, N, is larger than the number of unknown parameters, that is, the number of entries of p. In an embodiment of the present invention, the intensity threshold $I_t$ is one of the model parameters, that is, an entry of the vector p. One method of solving the set of nonlinear equations (Eqn. 3) is to minimize the cost function $f_1(p)$ defined by (Eqn. 2). The symbols $\tilde{w}_j$ in Eqn. 2 indicate positive weights for the terms which provides a method to apply a continuously variable emphasis on individual observations. The coordinates of points $r^j$ are obtained by measurements performed on a printed resist pattern. Measurements can be performed by a scanning electron microscope, scanning ion microscope, atomic force microscope, etc.

Figure 6A:
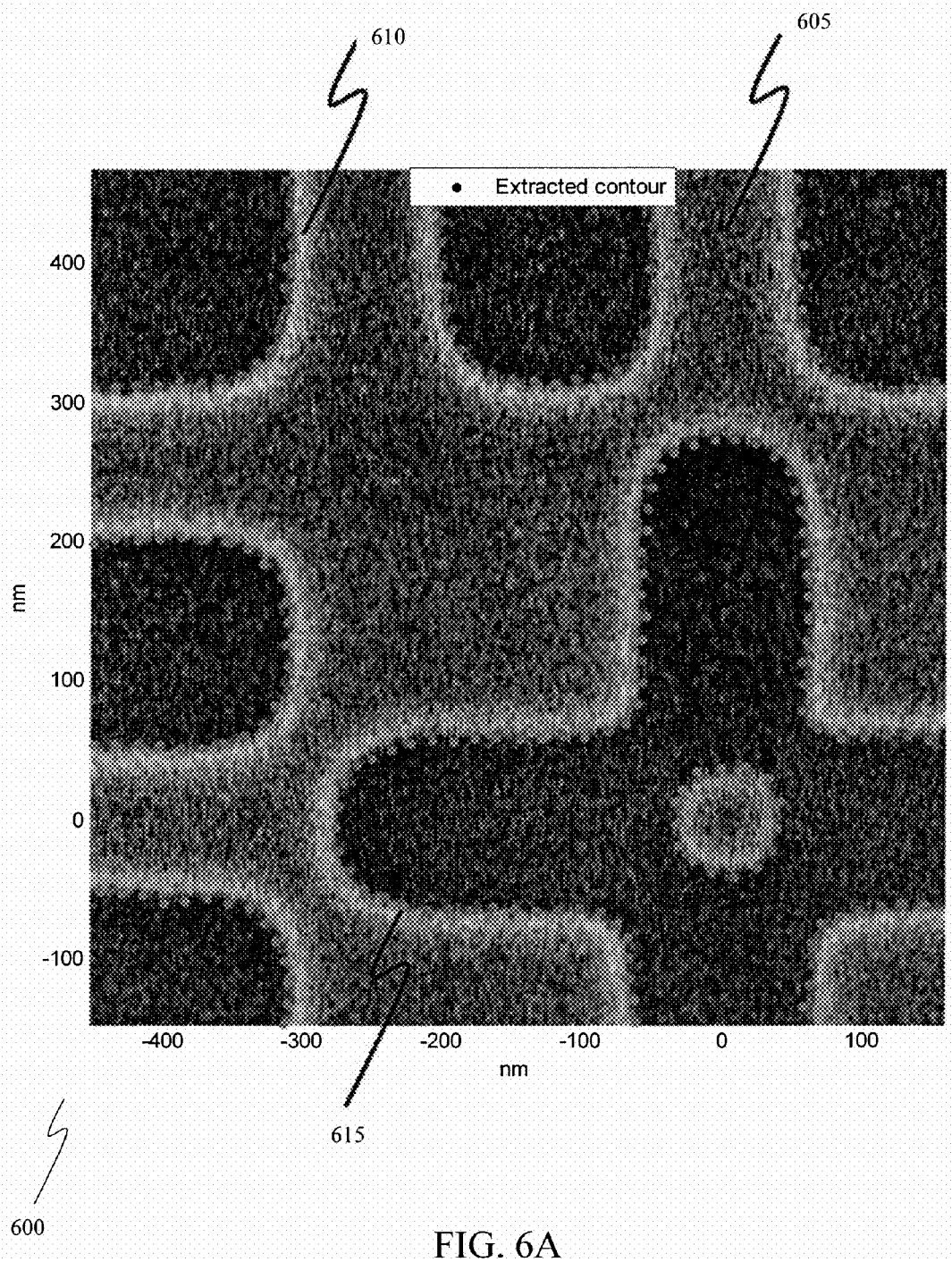
FIG. 6A illustrates an example top-down scanning electron microscope image of a resist pattern in accordance with one embodiment of the present invention.

In an embodiment of the present invention, a contour of a resist edge is obtained as a set of coordinates $r^j=(x^j, y_j)$; $j=1,2,\ldots,N$, which are then used in Eqn. 2 and Eqn. 3. FIG. 6A shows an SEM image 605 of a resist pattern on a photomask. The grey scale image 605 shows the secondary electron current that is detected when a focused electron beam is scanned across the resist pattern. SEM image edge detection methods are known to those skilled in the art. Commercial SEM systems are available (for example from Hitachi High Technologies, and Applied Materials, Inc.) that provide resist contours in the coordinate system of the test pattern layout.

Referring to FIG. 6A, each point 615 on the resist edge leads to one term in the summation of the cost function $f_1(p)$ in Eqn. 2. In one embodiment, the intensity-based cost function $f_1(p)$ is minimized with respect to the model parameters p using one or more of the following algorithms: Gauss-Newton, Newton, quasi-Newton, and Levenberg-Marquardt. In another embodiment, the intensity-based cost function $f_1(p)$ is minimized with respect to the model parameters p using one or more of simplex, simulated annealing, or evolutionary (genetic) algorithms.

In yet another embodiment, the coordinates of a point on a resist edge, $r_j=(x_j,y_j)$, are obtained by measuring the width of a symmetric feature. Examples of such features include, but are not limited to: (i) line gratings of constant pitch, where the measured dimension is the width of a line or the width of a space between the lines, and the measurement location is sufficiently far from edges of the grating; (ii) uniform arrays of contact holes or posts, wherein the measured dimension is the diameter of a contact hole or post, and the measurement location is sufficiently far from the edges of the array; (iii) an isolated line; (iv) an isolated space; (v) an isolated contact hole; (vi) an isolated post; (vii) the center line in a group of odd number of lines that have reflection symmetry with respect to the center line; and (viii) the center space in a group of odd number of parallel spaces. Because of the symmetry of the test pattern, the pattern formed in photoresist is assumed to have substantially the same symmetry. Consequently, the resist edges can be ±CDmeasured/2 away from the symmetry axis of the test pattern. The resist edge is typically located where the intensity is equal to the threshold of the resist. Accordingly, this condition defines that the intensity at ±CDmeasured/2 away from the symmetry axis is equal to the threshold intensity.

Figure 6B:
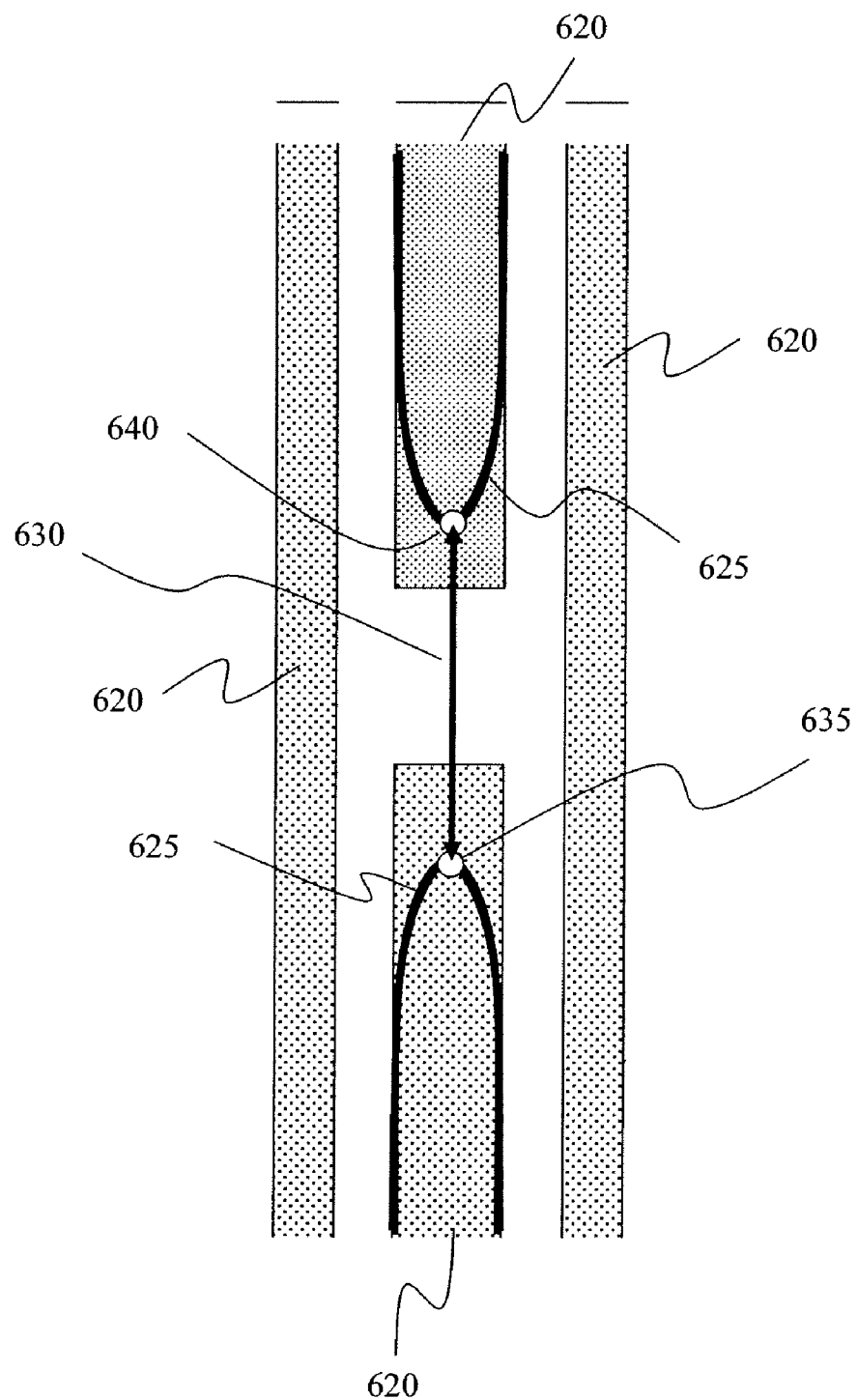
FIG. 6B illustrates an example symmetric pattern in accordance with one embodiment of the present invention.

Such is illustrated in FIG. 6B, where a symmetric pattern 620 is input to the patterning process. In this example, pattern 620 has reflection symmetry with respect to a horizontal and a vertical line passing through its center. Pattern 620 corresponds to test pattern 202 in FIG. 2A. Referring now to FIG. 6B, pattern 625 forms a resist pattern having edges 625. In this embodiment, it is assumed that the resist pattern 625 has the same symmetry properties as pattern 620. A scanning electron microscope is used to measure the critical dimension 630 along a line segment having the same symmetry as the pattern 620. The measurement of the critical dimension 630 is sufficient to determine the coordinates of the points 635 and 640 with respect to the center of pattern 620 by assuming that points 635 and 640 are symmetrically disposed with respect to the center of pattern 620. In this embodiment, acquiring contours of resist edges 625 is not needed. Each CD measurement such as 630 yields one equation in the system of equations Eqn. 3. This embodiment is suitable for lithography systems that substantially preserve the symmetry of the pattern.

In one embodiment, the calibration algorithm is configured to minimize an intensity-based cost function. In another embodiment, the calibration algorithm is configured to minimize a combination, such as a weighted sum, of an intensity-based cost function and a CD-based cost function.

In one embodiment, the calibration algorithm runs two optimization processes, the first optimization process uses a first cost function that is intensity-based; and the second optimization process uses a second cost function that is CD-based. This is in contrast to conventional model calibration methods, which only consider simulated wafer geometry and measured critical dimensions or contours.

Calibration of the mask making model 120 and the lithography model 125 is an iterative process and involves minimization of a cost function with respect to the parameters of said models. The term cost function and demerit function can be used interchangeably. Minimizing a demerit or cost function f(x) is equivalent to maximizing a merit or objective function such as −f(x). In one embodiment, a method of non-linear optimization, for example, the Levenberg-Marquardt algorithm is used to minimize the cost function.

In one embodiment, the intensity value can be determined based on test patterns with or without a symmetrical axis. In this embodiment, arbitrary test patterns can be used; however, an extra step is required. Each CD measurement is defined by a cut-line. The intensity profile is computed on the cut-line according to the lithography model such as modeling tool 115. First, two points on the cut-line that are separated by the measured CD and have equal calculated intensity are found. This procedure is similar to solving a non-linear equation of one variable. In one embodiment, this is achieved by: (i) computing intensity I(x) on the cut-line where x denotes position on the line; (ii) for each intensity value In, solving the equation In =I(x) for x; when this equation has two roots, $x_{1n}$ and $x_{2n}$ on a cut-line, recording the well defined distance CD=$|x_{1n}-x_{2n}|$; (iii) constructing a table of values $d_n=|x_{1n}-x_{2n}|$ versus $I_n$ for n=1,2, ... (iv) interpolating the table to evaluate the intensity I* that corresponds to d*=CDmeasured; and (v) using the difference (I*−threshold) in the cost function.

Figure 7:
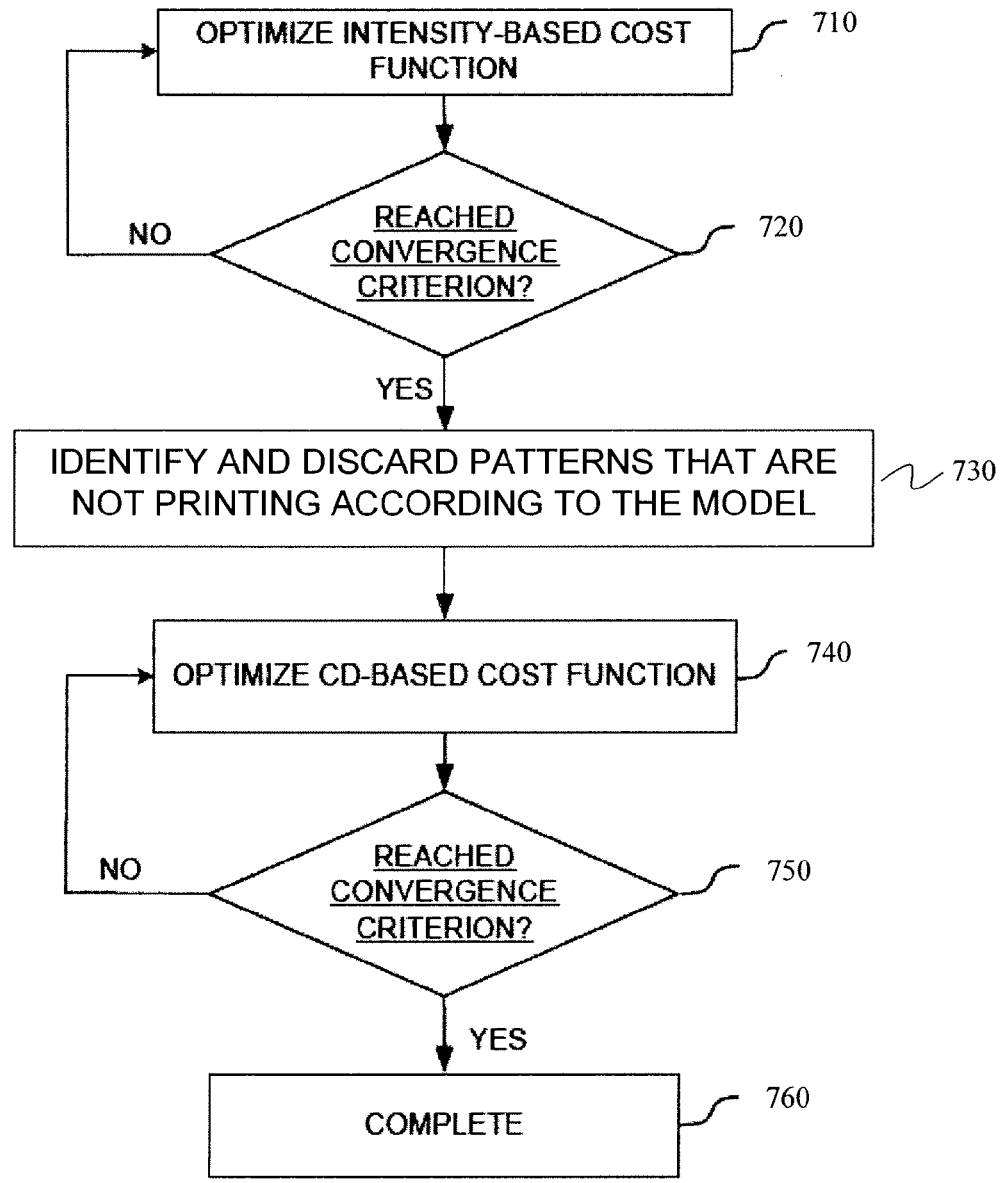
FIG. 7 illustrates an example process flow for calibrating a lithography model in accordance with one embodiment of the present invention.

Referring now to FIG. 7, in procedure 710, the intensity-based cost function is evaluated at every iteration, which is then analyzed to determine whether a convergence criterion is reached at a procedure 720. If the convergence criterion is not reached, the model parameters are changed and 710 and 720 are iterated. In an embodiment of the present invention, model parameters are changed in a way that will decrease the intensity-based cost function, changing comprising calculating gradient of the cost function with respect to the model parameters, or Jacobian matrix of a vector-valued cost function with respect to the model parameters, and stepping in a descent-direction. Methods to minimize smooth cost functions are well known. Then procedure 710 is repeated until the convergence criterion is met, and a first set of optimal model parameters, hence a first model, are obtained. In an embodiment, while the intensity-based cost function is minimized at 710 and 720, the CD-based cost-function is also calculated for the purpose of monitoring or for use in the convergence criterion at 720.

At procedure 730, patterns that are not printing according to the first model are determined and removed from the CD-based cost function. To illustrate how a non-printing feature is determined, we refer to FIG. 4, which illustrates a simulated image intensity profile 400 along a cutline (a line segment) and an intensity threshold 405. Image intensity profile 400 is generated using a lithography model such as modeling tool 115. As shown in FIG. 4, the intensity threshold is set at a certain level. Features on a wafer are represented by the intensity peaks such as peaks 410 and 416. The feature of peak 412 is a non-printing feature because the intensity value calculated by the model is lower than intensity threshold 405. The feature of peak 414 is a marginally printing feature—a feature that may or may not print. In this case, design engineer may decide to include or exclude this feature in the modeling process. In one embodiment, marginally printing feature is excluded from the CD-based cost function calculation process as with non-printing feature.

Referring again to procedure 730 of FIG. 7, as discussed above, once the convergence criterion is met at procedure 720 and the non-printing patterns are removed at procedure 730, process 700 continues to optimize the lithography model by minimizing the critical dimension (CD)-based cost function at procedure 740. Removing features that are not printing according to the current iteration of the model parameters makes the CD-based cost function well-defined (continuous and differentiable) in a neighborhood of the current model parameters. At a procedure 750, result from the minimization of the CD-based cost function is analyzed to determine whether a second convergence criterion is met. The second convergence criterion is one of, or any combination of: the value of the CD-based cost function falls below a predetermined threshold, a norm of the gradient of the CD-based cost function in the space of model parameters falls below a predetermined threshold, the CD-based cost function ceases to change significantly, a predetermined number of iterations or computation time is exceeded. If the convergence criterion is not met at procedure 750, then model parameters are changed and procedures 740-750 are repeated. In a preferred embodiment, model parameters are changed according to one of: Levenberg-Marquardt, Gauss-Newton, or quasi-Newton algorithms. The procedure 730 ensures that the CD-based cost-function is well defined at the start of procedure 740. If the CD-based cost function becomes ill-defined, that is a feature does not print according to the current iterate of the model, during iteration 740-750, then procedure 740 backtracks towards the last point at which the CD-based cost function was well defined in the space of model parameters. If the convergence criterion is met at procedure 750, process 700 is completed at procedure 760 where a second set of optimal model parameters, hence second model, are saved for future use.

In one embodiment of the present invention, the weights in Eqn.1 of the CD-based cost function are set to $w_j=1/\text{Variance}(CD_j)$, the reciprocal of the statistical variance of the j th measurement. The variance includes variations in the metrology and the variations in printing the feature. The variance can be obtained by printing a multitude of identical features, measuring them, and calculating the sample variance of the measurements.

Figure 8:
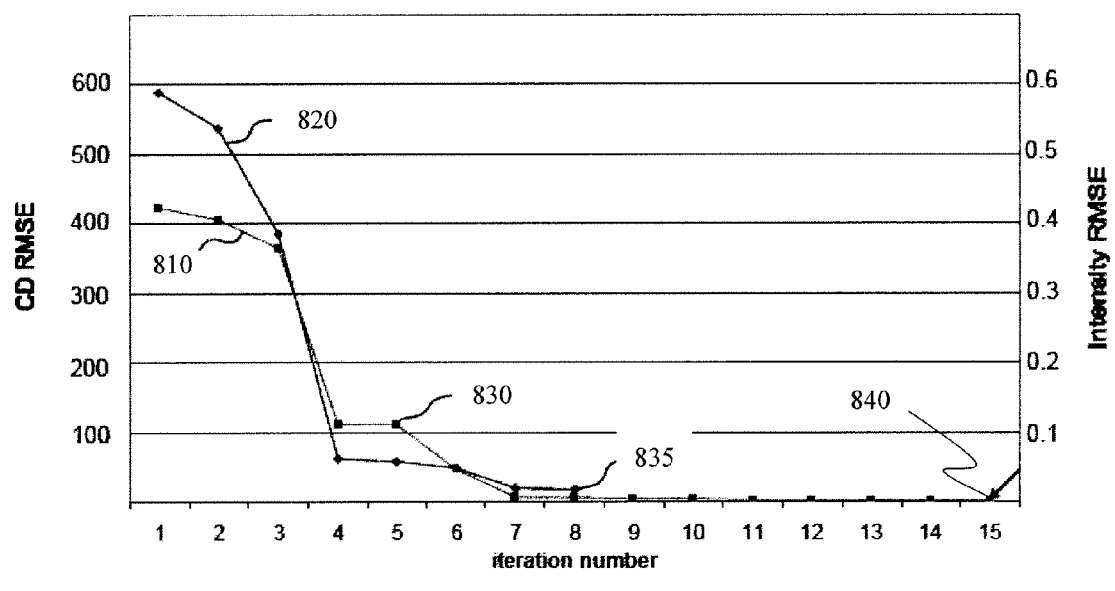
FIG. 8 illustrates an example intensity-based cost function and a CD-based cost function being sequentially minimized in accordance with one embodiment of the present invention.
Figure 8:

By excluding non-printing measurements, the CD-based cost function optimization process can converge at a faster rate. FIG. 8 illustrates how CD-based and intensity-based cost functions change during optimization procedures 710 and 740 of FIG. 7 according to an embodiment of the present invention. Referring now to FIG. 8, graph 820 is the value of the intensity-based cost function versus iteration number and graph 810 is the value of the CD-based cost function versus iteration number. During the first eight iterations in the example of FIG. 8, the intensity-based cost function is minimized iteratively, which corresponds to procedure 710 in FIG. 7. The CD-based cost function is also calculated in this example, but it is not used to calculate a search direction or a step size in the optimization algorithm during the first optimization stage (710, 720 in FIG. 7).

In the first stage, CD-based cost function is calculated for the purpose of monitoring and in an embodiment, to determine when to stop the minimization of the intensity-based cost function. The number of iterations to minimize the intensity-based cost function is determined according to a stopping criterion at 720. Stopping criterion for the intensity-based minimization is one of, or a combination of: the value of the intensity-based cost function falls below a predetermined threshold, a norm of the gradient of the intensity-based cost function in the space of model parameters falls below a predetermined threshold, the intensity-based cost function ceases to change significantly, the value of the CD-based cost function falls below a predetermined threshold, the value of the CD-based cost function increases, a predetermined number of iterations or computation time is exceeded. The number of iterations shown in FIG. 8, eight, is an example. It is not to be construed as a preferred value or a fixed number.

Graph 810 is calculated with measurements of non-printing features excluded. At iteration 8 of profile 810, the CD-based root mean square error (CD RMSE) value is approximately 5.4 as compared to final value 370.01 nm in prior art shown in FIG. 5 at 510. At iteration eight, the intensity-based optimization calculation is stopped in the example of FIG. 8 because a convergence criterion is met. Because the intensity-based cost function is a continuous and differentiable function of model parameters, its minimization by a quadratically convergent optimization algorithm does not stall and proceeds efficiently.

As shown by graph 810 of FIG. 8, starting at iteration 9 in this example, the CD-based cost function optimization process 750 (FIG. 7) continues after the minimization of the intensity-based cost function satisfies its convergence criterion 720, and non-printing features are discarded at 730. Minimization of the CD-based cost function terminates at 840, at iteration 15 in this example, because the convergence criterion is reached at 750.

The intensity-based cost function is sufficient to calibrate the model; therefore, only processes 710 and 720 are used to calibrate the model in one embodiment of the present invention.

In one embodiment, the procedures 730-760 in FIG. 7 facilitate measuring critical dimensions (CD) and quantifying variance of CD measurements. However, image intensity is not observable with sufficient resolution with a sensor other than an actinic resist. There are two reasons for this. The first reason is that the image intensity in question is a latent image intensity, which corresponds to the spatial map of the concentration of a molecule in the resist. This is because the lithography model can include the diffusion of molecules in the resist. There is no direct observation of the latent image other than developing the resist, and measuring the geometry of the developed resist pattern.

The second reason is that even in the case where an optical intensity is considered, at the time of this writing, pixels of CCD or CMOS detector arrays are generally an order of magnitude larger than the minimum dimensions of advanced logic integrated circuits such as microprocessors. Therefore, the lithographic image that is used to produce a CPU chip, for example, is hard to measure directly with sufficient resolution. By contrast, small dimensions of developed resist features are measurable by SEM, AFM or ion microscopy.

Within the context of procedures 730-760 in FIG. 7, the CD-based cost function more directly compares a simulation result with an observable quantity. The purpose of processes 730, 740, and 750 is to minimize the difference between model predictions and observations of known or quantifiable error bars. The purpose of processes 710 and 720, which use the intensity-based cost function, is to find a good initial model using a fail-proof algorithm. The combined process 700 is robust and fail-proof yet efficient. Processes 710, 720, 730 are capable of identifying and discarding invalid measurements in some cases. For example, in hyper-NA lithography using a dipole illumination, when the image is out of focus, a wide line can print as several narrow lines and spaces. An automated SEM metrology recipe may measure one of the narrow lines and report it as the width of the wide line. This is one of the cases when the association between the simulated and measured features can break down. Processes 710, 720, 730 identify and discard such invalid measurements.

Figure 9:
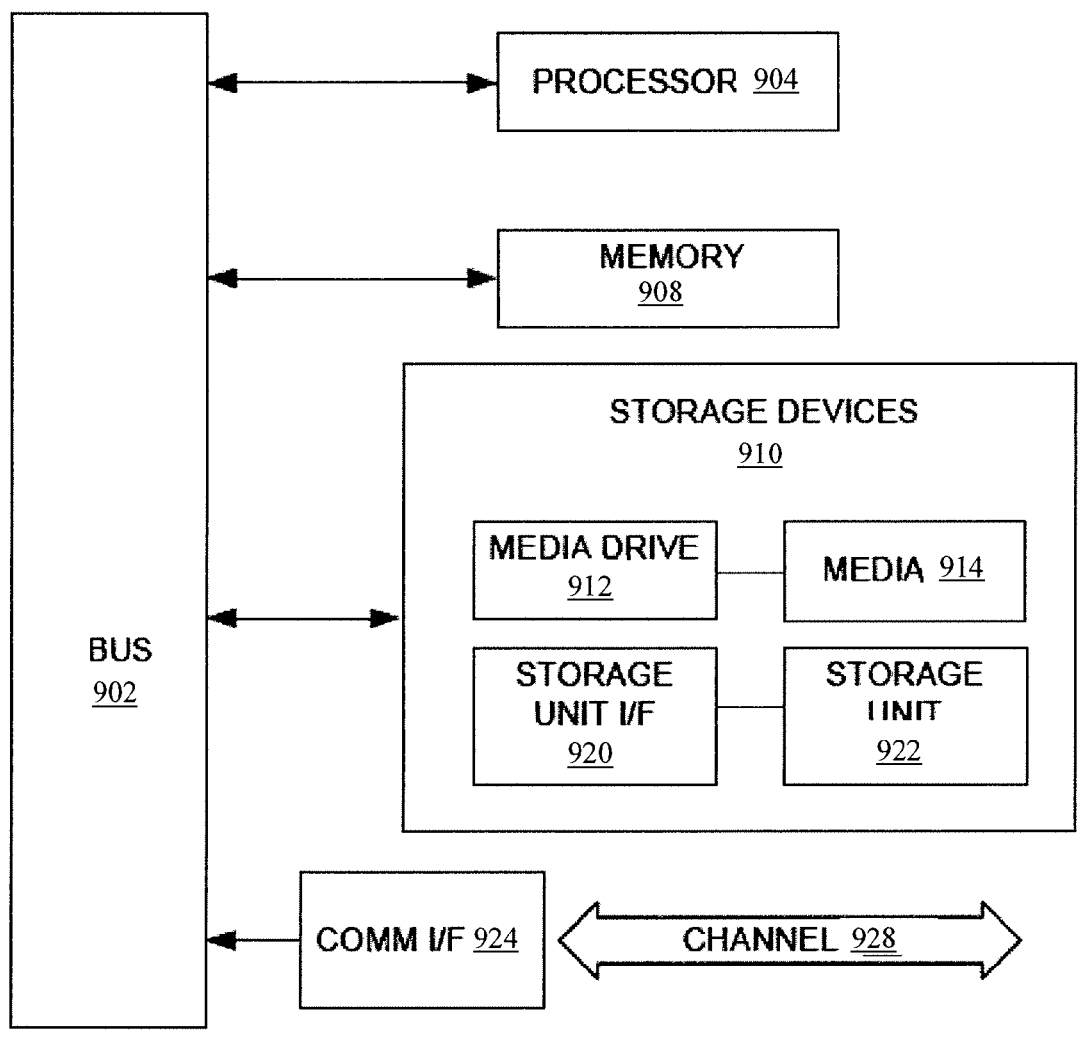
FIG. 9 illustrates an example computer system, in which the model calibration tool can be implemented.

As used herein, the term module might describe a given unit of functionality that can be performed in accordance with one or more embodiments of the present invention. As used herein, a module might be implemented utilizing any form of hardware, software, or a combination thereof. For example, software, firmware, one or more processors, controllers, ASICs, PLAs, logical components or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 9. Various embodiments are described in terms of this example-computing module 900. After reading this description, it will become apparent to a person skilled in the relevant art how to implement the invention using other computing modules or architectures.

Referring now to FIG. 9, computing module 900 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 900 might also represent computing capabilities embedded within or otherwise available to a given device. For example, a computing module might be found in other electronic devices such as, for example, digital cameras, navigation systems, cellular telephones, portable computing devices, modems, routers, WAPs, and other electronic devices that might include some form of processing capability.

Computing module 900 might include, for example, one or more processors or processing devices, such as a processor 904. Processor 904 might be implemented using a general-purpose or special-purpose processing engine such as, for example, a microprocessor, controller, or other control logic. In the example illustrated in FIG. 9, processor 904 is connected to a bus 902 or other communication medium to facilitate interaction with other components of computing module 900.

Computing module 900 might also include one or more memory modules, referred to as memory 908. For example, preferably random access memory (RAM) or other dynamic memory, might be used for storing information and instructions to be executed by processor 904. Memory 908 might also be used for storing temporary variables or other intermediate information during execution of instructions to be executed by processor 904. Computing module 900 might likewise include a read-only memory ("ROM") or other static storage device coupled to bus 902 for storing static information and instructions for processor 904.

The computing module 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive. Accordingly, storage media 914, might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein particular computer software or data.

In alternative embodiments, information storage mechanism 910 might include other similar instrumentalities for allowing computer programs or other instructions or data to be loaded into computing module 900. Such instrumentalities might include, for example, a fixed or removable storage unit 922 and an interface 920. Examples of such storage units 922 and interfaces 920 can include a program cartridge and cartridge interface, a removable memory (for example, a flash memory or other removable memory module) and memory slot, a PCMCIA slot and card, and other fixed or removable storage units 922 and interfaces 920 that allow software and data to be transferred from the storage unit 922 to computing module 900.

Computing module 900 might also include a communications interface 924. Communications interface 924 might be used to allow software and data to be transferred between computing module 900 and external devices. Examples of communications interface 924 might include a modem or soft modem, a network interface (such as an Ethernet, network interface card, WiMedia, 802.XX or other interface), a communications port (such as for example, a USB port, IR port, RS232 port, Bluetooth interface, or other port), or other communications interface. Software and data transferred via communications interface 924 might typically be carried on signals, which can be electronic, electromagnetic, optical or other signals capable of being exchanged by a given communications interface 924. These signals might be provided to communications interface 924 via a channel 928. This channel 928 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 908, storage unit 922, media 914, and signals on channel 928. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 900 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for calibrating a model of a photolithography process, comprising:

providing a computational model of a photolithography process, the computational model having an adjustable parameter;

printing a first pattern with the photolithography process as a printed pattern;

measuring an aspect of the printed pattern;

using the computational model to calculate an image intensity at a location determined according to the measured aspect;

minimizing a first cost function that comprises a first difference between the calculated image intensity and an intensity threshold;

calculating a second cost function comprising a second difference between a measured critical dimension of the printed pattern and a critical dimension simulated by the computational model;

minimizing the first cost function with respect to a model parameter;

determining if the computational model predicts that a portion of a first pattern will not print;

removing from a definition of the second cost function, the critical dimension of the portion of the first pattern that will not print; and minimizing the second cost function with respect to the model parameter.

2. The method of claim 1, wherein the photolithography process comprises projecting an optical image onto a semiconductor wafer.

3. The method of claim 1, wherein the photolithography process comprises projecting an electron-beam image exposing a resist on a semiconductor wafer.

4. The method of claim 1, wherein the photolithography process comprises scanning a switched electron beam exposing a resist on a semiconductor wafer.

5. The method of claim 1, wherein the photolithography process comprises an electron beam exposing a resist on a photomask.

6. A computer program product having instructions embedded in a non-transitory computer useable medium, the instructions configured to cause a processor to perform the operations of:
 providing a computational model of a photolithography process, the computational model having an adjustable parameter;
 printing a first pattern with the photolithography process as a printed pattern;
 measuring an aspect of the printed pattern;
 using the computational model to calculate an image intensity at a location determined according to the measured aspect;
 minimizing a first cost function that comprises a first difference between the calculated image intensity and an intensity threshold;
 calculating a second cost function comprising a second difference between a measured critical dimension of the printed pattern and a critical dimension simulated by the computational model;
 minimizing the first cost function with respect to a model parameter;
 determining if the computational model predicts that a portion of a first pattern will not print;
 removing from a definition of the second cost function, the critical dimension of the portion of the first pattern that will not print; and
 minimizing the second cost function with respect to the model parameter.

7. The computer program product of claim 6, wherein the photolithography process comprises projecting an optical image onto a semiconductor wafer.

8. The computer program product of claim 6, wherein the photolithography process comprises projecting an electron-beam image exposing a resist on a semiconductor wafer.

9. The computer program product of claim 6, wherein the photolithography process comprises scanning a switched electron beam exposing a resist on a semiconductor wafer.

10. The computer program product of claim 6, wherein the photolithography process comprises an electron beam exposing a resist on a photomask.

11. A computer-aided design tool configured to calibrate a model of photolithography process, comprising:
 a processor;
 a memory connected to the processor; and
 a non-transitory computer readable medium having instructions embedded therein, the instructions configured to cause the processor to perform the operations of:
  providing a computational model of a photolithography process, the computational model having an adjustable parameter;
  printing a first pattern with the photolithography process as a printed pattern;
  measuring an aspect of the printed pattern;
  using the computational model to calculate an image intensity at a location determined according to the measured aspect;
  minimizing a first cost function that comprises a first difference between the calculated image intensity and an intensity threshold;
  calculating a second cost function comprising a second difference between a measured critical dimension of the printed pattern and a critical dimension simulated by the computational model;
  minimizing the first cost function with respect to a model parameter;
  determining if the computational model predicts that a portion of a first pattern will not print;
  removing from a definition of the second cost function, the critical dimension of the portion of the first pattern that will not print; and
 minimizing the second cost function with respect to the model parameter.

12. The computer-aided design tool of claim 11, wherein the photolithography process comprises projecting an optical image onto a semiconductor wafer.

13. The computer-aided design tool of claim 11 wherein the photolithography process comprises projecting an electron-beam image exposing a resist on a semiconductor wafer.

14. The computer-aided design tool of claim 11, wherein the photolithography process comprises scanning a switched electron beam exposing a resist on a semiconductor wafer.

15. The computer-aided design tool of claim 11, wherein the photolithography process comprises an electron beam exposing a resist on a photomask.

* * * * *